US012631962B2

(12) United States Patent
Inari et al.

(10) Patent No.: US 12,631,962 B2
(45) Date of Patent: May 19, 2026

(54) RESIST COMPOSITION AND METHOD FOR FORMING RESIST PATTERN

(71) Applicant: TOKYO OHKA KOGYO CO., LTD., Kawasaki (JP)

(72) Inventors: Takatoshi Inari, Kawasaki (JP); Masatoshi Arai, Kawasaki (JP); Yoshitaka Komuro, Kawasaki (JP)

(73) Assignee: TOKYO OHKA KOGYO CO., LTD., Kawasaki (JP)

(*) Notice: Subject to any disclaimer, the term of this patent is extended or adjusted under 35 U.S.C. 154(b) by 515 days.

(21) Appl. No.: 18/334,191

(22) Filed: Jun. 13, 2023

(65) Prior Publication Data

US 2023/0408917 A1 Dec. 21, 2023

(30) Foreign Application Priority Data

Jun. 16, 2022 (JP) ................................. 2022-097528

(51) Int. Cl.
*G03F 7/004* (2006.01)
*G03F 7/20* (2006.01)

(52) U.S. Cl.
CPC .......... *G03F 7/0043* (2013.01); *G03F 7/2006* (2013.01)

(58) Field of Classification Search
None
See application file for complete search history.

(56) References Cited

U.S. PATENT DOCUMENTS

| | | | |
|---|---|---|---|
| 2015/0192851 A1 | 7/2015 | Yamashita et al. | |
| 2017/0052448 A1* | 2/2017 | Nakagawa .............. | G03F 7/322 |
| 2017/0146909 A1 | 5/2017 | Smith et al. | |
| 2022/0005687 A1 | 1/2022 | Liu et al. | |

FOREIGN PATENT DOCUMENTS

| | | |
|---|---|---|
| JP | 2015-108781 A | 6/2015 |
| JP | 2021-165842 A | 10/2021 |
| JP | 2022-013909 A | 1/2022 |

OTHER PUBLICATIONS

Xu, H., Kosma, V., Sakai, K., Gianellis, E.P., Ober, C.K.—EUV photolithography: resist progress in metal-organic complex photoresists, J. Micro/Nanolith, MEMS MOEMS 18(1), 011007, Jan.-Mar. 2019 (Year: 2019).*

Siauw, M., Du, K., Valade, D., Trefonas, P., Thackeray, J.W., Whittaker, A., Blakey, I.—Systematic investigation of the synthesis, characterization and switching mechanism of metal oxide nanoparticle resists, Proc of SPIE vol. 9779 97790J-1, 2016 (Year: 2016).*

* cited by examiner

*Primary Examiner* — Anca Eoff
(74) *Attorney, Agent, or Firm* — KNOBBE, MARTENS, OLSON & BEAR LLP

(57) ABSTRACT

A resist composition containing a metal compound, in which a structure of the metal compound is changed upon exposure, and the metal compound exhibits changed solubility in a developing solution, in which the metal compound includes a cubane-structured metal oxide.

5 Claims, No Drawings

RESIST COMPOSITION AND METHOD FOR FORMING RESIST PATTERN

BACKGROUND OF THE INVENTION

Field of the Invention

The present invention relates to a resist composition and a method for forming a resist pattern.

Priority is claimed on Japanese Patent Application No. 2022-097528, filed Jun. 16, 2022, the content of which is incorporated herein by reference.

Description of Related Art

In recent years, in the manufacture of semiconductor elements and liquid crystal display elements, with advances in lithography techniques, rapid progress in the field of pattern fining has been achieved. Typically, pattern fining techniques involve shortening the wavelength (increasing the energy) of the light source for exposure.

Resist materials have been required to have lithography characteristics such as sensitivity to these light sources for exposure and resolution capable of reproducing a fine-sized pattern. As a resist material that satisfies these requirements, a chemical amplification-type resist composition that contains a base material component that exhibits changed solubility in a developing solution under action of acid, and an acid generator component that generates acid upon exposure has been conventionally used in the related art.

Recently, as a resist material suitable for reproducing a finer pattern, a resist composition containing a compound containing a metal atom as a base material component has been proposed. In a resist composition containing a metal compound as a base material component, the metal compound exhibits reduced solubility in a developing solution upon exposure, and a pattern is formed. Unlike the chemical amplification-type resist composition, this resist composition is more suitable for forming a fine pattern since acid diffusion is not involved.

For example, Japanese Unexamined Patent Application, First Publication No. 2015-108781 discloses a negative-tone resist composition characterized by containing a complex having a specific structure, in which a plurality of ligands are bonded to hafnium (Hf) or zirconium (Zr), and containing a polymerization initiator. It is disclosed that the negative-tone resist composition contains a metal exhibiting high absorption with respect to EUV light and has good temporal stability.

SUMMARY OF THE INVENTION

In the EUV photolithography process in the manufacturing of semiconductors, the resist composition is required to have high sensitivity to a light source for exposure, roughness reducing property, and scum reduction in association with pattern fining.

However, in the resist compositions in the related art as described above, by using a resist containing a metal compound, EUV light absorption can be improved, and sensitivity and roughness can be improved. However, the metal resist has low solubility in a resist solvent and a developing solution, the scum tends to increase, and it has been difficult to satisfy all of these characteristics.

The present invention has been made in consideration of the above circumstances, and an object of the present invention is to provide a resist composition that has increased sensitivity and makes it possible to reduce roughness and scum and provide a method for forming a resist pattern by using the resist composition.

In order to achieve the above-described object, the present invention employs the following configurations.

That is, a first aspect of the present invention is a resist composition containing a metal compound, in which a structure of the metal compound is changed upon exposure, and the metal compound exhibits changed solubility in a developing solution, where the metal compound includes a cubane-structured metal oxide.

The second aspect according to the present invention is a method for forming a resist pattern, including a step of forming a resist film on a support using the resist composition according to the first aspect, a step of exposing the resist film, and a step of developing the exposed resist film to form a resist pattern.

According to the present invention, it is possible to provide a resist composition that has increased sensitivity and makes it possible to reduce roughness and scum and provide a method for forming a resist pattern by using the resist composition.

DETAILED DESCRIPTION OF THE INVENTION

In the present specification and the scope of the present patent claims, the term "aliphatic" is a relative concept used with respect to the term "aromatic" and defines a group or compound that has no aromaticity.

The "alkyl group" includes a monovalent saturated hydrocarbon group that is linear, branched, or cyclic, unless otherwise specified. The same applies to the alkyl group of the alkoxy group.

The "alkylene group" includes a divalent saturated hydrocarbon group that is linear, branched, or cyclic, unless otherwise specified.

Examples of the "halogen atom" include a fluorine atom, a chlorine atom, a bromine atom, and an iodine atom.

In a case where "may have a substituent" is described, both of a case where a hydrogen atom (—H) is substituted with a monovalent group and a case where a methylene group ($—CH_2—$) is substituted with a divalent group are included.

The term "exposure" is used as a concept that includes irradiation with any form of radiation.

The term "base material component" is a compound having a film-forming ability. In the present specification, the compound that is used as a base material component is a metal compound. As will be described later, a metal compound has a structure in which a metal or a metal oxide is bonded to a bonder, and the structure of the metal compound is changed upon exposure. The bonder may be an inorganic compound or may be an organic compound.

The term "derivative" is used as a concept that includes a compound obtained by substituting a hydrogen atom at the α-position of an object compound with another substituent such as an alkyl group or a halogenated alkyl group; and a derivative thereof. Examples of the derivatives thereof include a derivative in which the hydrogen atom of the hydroxyl group of the object compound in which the hydrogen atom at the α-position may be substituted with a substituent is substituted with an organic group; and a derivative in which a substituent other than a hydroxyl group is bonded to the object compound in which the hydrogen atom at the α-position may be substituted with a substituent.

The α-position refers to the first carbon atom adjacent to the functional group unless otherwise specified.

In the present specification and the scope of the present patent claims, asymmetric carbon atoms may be present, and thus enantiomers or diastereomers may be present depending on the structures represented by the chemical formula. In that case, these isomers are represented by one chemical formula. These isomers may be used alone or in the form of a mixture.

(Resist Composition)

The resist composition according to the first aspect of the present invention is a resist composition containing a metal compound (M) (hereinafter, also referred to as a "component (M)"), in which the structure of the metal compound (M) is changed upon exposure, and the metal compound (M) exhibits changed solubility in a developing solution.

In a case where a resist film is formed using the resist composition according to the present embodiment and the formed resist film is subjected to selective exposure, the component (M) exhibits changed solubility in a developing solution at exposed portions, whereas the component (M) exhibits unchanged solubility in a developing solution at unexposed portions of the resist film, which generates the difference in solubility in the developing solution between the exposed portion and unexposed portions. Therefore, by subjecting the resist film to development, exposed portions of the resist film are dissolved and removed to form a positive-tone resist pattern in a case where the resist composition is a positive-tone type, whereas unexposed portions of the resist film are dissolved and removed to form a negative-tone resist pattern in a case where the resist composition is a negative-tone type.

In the present specification, a resist composition which forms a positive-tone resist pattern by dissolving and removing exposed portions of the resist film is called a positive-tone resist composition, and a resist composition which forms a negative-tone resist pattern by dissolving and removing unexposed portions of the resist film is called a negative-tone resist composition. The resist composition according to the present embodiment is typically a negative-tone resist composition. In addition, at the time of the formation of a resist pattern, the resist composition according to the present embodiment may be applied to an alkali developing process using an alkali developing solution in the developing treatment, or may be applied to a solvent developing process using a developing solution containing an organic solvent (an organic developing solution).

<Metal Compound (M)>

The resist composition according to the present embodiment contains a metal compound (M).

The metal compound (M) contains a cubane-structured metal oxide (M1) (hereinafter, also referred to as a "component (M1)"). The metal compound (M) may contain a metal compound (M2) other than the component (M1). Examples of the metal compound (M2) include a known metal complex that is used as a resist material.

<<Cubane-Structured Metal Oxide (M1)>>

The component (M1) is a compound having a cubic skeleton in which metal atoms and oxygen atoms are alternately disposed at each apex of a cube.

Specific examples of the component (M1) include a compound represented by General Formula (m-0).

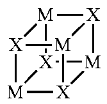

(m-0)

[In the formula, M represents a metal atom of Group 3 to Group 16 and contains a bonder that is bonded to the metal atom. X represents an oxygen atom and may contain a bonder that is bonded to the oxygen atom. M may be bonded to X through a bonder.]

In General Formula (m-0), M represents a metal atom of Group 3 to Group 16 and contains a bonder that is bonded to the metal atom.

The metal atom may be a metal ion of a metal atom of Group 3 to Group 16.

[Metal Atom]

Examples of the Group 3 metal atom include scandium (Sc) and yttrium (Y).

Examples of the Group 4 metal atom include titanium (Ti), zirconium (Zr), and hafnium (Hf).

Examples of the Group 5 metal atom include vanadium (V), niobium (Nb), and tantalum (Ta).

Examples of the Group 6 metal atom include chromium (Cr), molybdenum (Mo), and tungsten (W).

Examples of the Group 7 metal atom include manganese (Mn), technetium (Tc), and rhenium (Re).

Examples of the Group 8 metal atom include iron (Fe), ruthenium (Ru), and osmium (Os).

Examples of the Group 9 metal atom include cobalt (Co), rhodium (Rh), and iridium (Ir).

Examples of the Group 10 metal atom include nickel (Ni), palladium (Pd), and platinum (Pt).

Examples of the Group 11 metal atom include copper (Cu), silver (Ag), and gold (Au).

Examples of the Group 12 metal atom include zinc (Zn), cadmium (Cd), and mercury (g).

Examples of the Group 13 metal atom include aluminum (Al), gallium (Ga), indium (In), and thallium (Tl).

Examples of the Group 14 metal atom include germanium (Ga), tin (Sn), and lead (Pb).

Examples of the Group 15 metal atom include antimony (Sb) and bismuth (Bi).

Examples of the Group 16 metal atom include tellurium (Te) and polonium (Po).

Among the above, the metal atom is preferably Sn, In, Te, Ni, Co, W, Bi, Pb, Sb, Pd, Zn, Hf, Ge, Ga, Cr, or Mn, more preferably Sn, In, Te, Ni, Co, W, Bi, Pb, Sb, Pd, or Zn, and still more preferably Sn, In, Te, Ni, Co, or W, from the viewpoint of further enhancing the absorption of EUV. The metal atom may be a metal ion.

Specific examples of the metal ion include a tin ion ($Sn^{2+}$ or $Sn^{4+}$), an indium ion ($In^{+}$ or $In^{3+}$), a tellurium ion ($Te^{4+}$), a nickel ion ($Ni^{2+}$ or $Ni^{3+}$), a cobalt ion ($Co^{2+}$ or $Co^{3+}$), and a tungsten ion ($W^{2+}$, $W^{4+}$, $W^{5+}$, or $W^{6+}$).

[Bonder that is Bonded to Metal Atom]

Examples of the bonder that is bonded to a metal atom include $H_2O$, an inorganic anion, a bonder represented by Formula (Y1-0), and a bonder represented by Formula (Y2-0).

Examples of the inorganic anion include a hydroxide ion ($OH^-$), a hydrogen sulfide ion ($SH^-$), a metaphosphate ion $$(PO_3^-),$$

and a nitrate ion $$(NO_3^-).$$

Bonder Represented by Formula (Y1-0)

Examples of the bonder that is bonded to a metal atom include a bonder represented by Formula (Y1-0). The bonder represented by Formula (Y1-0) is a bonder that forms a coordinate bond to a metal atom.

$$(Rm^{01})_m - (An^{01})_n \quad (Y1\text{-}0)$$

[In the formula, $Rm^{01}$ represents an organic group. $An^{01}$ represents an anion group. m represents an integer in a range of 1 to 4. n represents an integer in a range of 1 to 4. In a case where m and n represent an integer of 2 or more, a plurality of $Rm^{01}$'s may be the same or different from each other, and a plurality of $An^{01}$'s may be the same or different from each other,]

In Formula (Y1-0), $Rm^{01}$ represents an organic group. Examples of the organic group include a hydrocarbon group having 1 to 20 carbon atoms, which may have a substituent. The hydrocarbon group preferably has 1 to 18 carbon atoms, more preferably 1 to 16 carbon atoms, and still more preferably 1 to 10 carbon atoms. The hydrocarbon group may be an aliphatic hydrocarbon group or an aromatic hydrocarbon group.

The aliphatic hydrocarbon group may be saturated or may be unsaturated. The aliphatic hydrocarbon group may be linear or may be branched.

The linear saturated aliphatic hydrocarbon group is preferably an alkyl group having 1 to 15 carbon atoms, more preferably an alkyl group having 1 to 10 carbon atoms, and still more preferably an alkyl group having 1 to 6 carbon atoms.

The linear unsaturated aliphatic hydrocarbon group is preferably an alkenyl group or alkynyl group having 2 to 15 carbon atoms, more preferably an alkenyl group or alkynyl group having 2 to 10 carbon atoms, and still more preferably an alkenyl group or alkynyl group having 2 to 6 carbon atoms.

The branched saturated aliphatic hydrocarbon group is preferably a branched alkyl group having 3 to 15 carbon atoms, more preferably a branched alkyl group having 3 to 10 carbon atoms, and still more preferably a branched alkyl group having 3 to 6 carbon atoms.

The branched unsaturated aliphatic hydrocarbon group is preferably a branched alkenyl group or alkynyl group having 3 to 15 carbon atoms, more preferably a branched alkenyl group or alkynyl group having 3 to 10 carbon atoms, and still more preferably a branched alkenyl group or alkynyl group having 3 to 6 carbon atoms.

The aliphatic hydrocarbon group may contain a ring in the structure thereof. Examples of the aliphatic hydrocarbon group containing a ring in the structure thereof include a cyclic aliphatic hydrocarbon group which may have a substituent containing a hetero atom in the ring structure thereof (a group obtained by removing two hydrogen atoms from an aliphatic hydrocarbon ring), a group obtained by bonding the cyclic aliphatic hydrocarbon group to the terminal of a linear or branched aliphatic hydrocarbon group, and a group obtained by interposing the cyclic aliphatic hydrocarbon group in a linear or branched aliphatic hydrocarbon group. The cyclic aliphatic hydrocarbon group preferably has 3 to 15 carbon atoms, more preferably 3 to 10 carbon atoms, and still more preferably 3 to 6 carbon atoms. The cyclic aliphatic hydrocarbon group may be polycyclic or may be monocyclic.

The aliphatic hydrocarbon group which is a monocyclic group is preferably a group obtained by removing one hydrogen atom from a monocycloalkane. The monocycloalkane preferably has 3 to 6 carbon atoms, and specific examples thereof include cyclopentane and cyclohexane.

The aliphatic hydrocarbon group which is a polycyclic group is preferably a group obtained by removing one hydrogen atom from a polycycloalkane. The polycycloalkane preferably has 7 to 12 carbon atoms, and specific examples thereof include adamantane, norbornane, isobornane, tricyclodecane, and tetracyclododecane.

The organic group as $Rm^{01}$ may be an aromatic hydrocarbon group. The aromatic hydrocarbon group is a hydrocarbon group having at least one aromatic ring.

The aromatic ring is not particularly limited as long as it is a cyclic conjugated system having (4n+2) $\pi$ electrons, and may be monocyclic or polycyclic. The aromatic ring preferably has 5 to 20 carbon atoms, more preferably 6 to 15 carbon atoms, and still more preferably 6 to 12 carbon atoms.

Specific examples of the aromatic ring include aromatic hydrocarbon rings such as benzene, naphthalene, anthracene, and phenanthrene; and an aromatic heterocyclic ring obtained by substituting a part of carbon atoms constituting the above-described aromatic hydrocarbon ring with a hetero atom. Examples of the hetero atom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group obtained by removing one hydrogen atom from the above-described aromatic hydrocarbon ring or aromatic heterocyclic ring (an aryl group or a heteroaryl group); a group obtained by removing one hydrogen atom from an aromatic compound having two or more aromatic rings (for example, biphenyl or fluorene); and a group obtained by substituting one hydrogen atom of the above-described aromatic hydrocarbon ring or aromatic heterocyclic ring with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group that is bonded to the aromatic hydrocarbon ring or the aromatic heterocyclic ring preferably has 1 to 4 carbon atoms, more preferably 1 to 3 carbon atoms, and particularly preferably 1 or 2 carbon atoms.

The hydrocarbon group as $Rm^{01}$ may have a substituent. The substituent may be a substituent that is substituted for a hydrogen atom (—H) of a hydrocarbon chain or may be a substituent that is substituted for a methylene group ($—CH_2—$) of a hydrocarbon chain.

Examples of the group that is substituted for a hydrogen atom include a carboxy group, a hydroxy group, an amino group, a sulfo group, a nitro group, a thiol group, a cyano group, a phosphoric acid group, a halogen atom, an alkoxy group, and an acyl group, but are not limited thereto. The alkoxy group and the acyl group as the substituent preferably have 1 to 6 carbon atoms, more preferably 1 to 3 carbon atoms, and still more preferably 1 or 2 carbon atoms.

Examples of the group that is substituted for a methylene group include —O—, —C(═O)—O—, —O—C(═O)—, —C(═O)—, —O—C(═O)—O—, —C(═O)—NH—, —NH—C(═O)—, —NH—, —S—, —S(═O)$_2$—, and —S(═O)$_2$—O—, but are not limited thereto.

Specific examples of the organic group as Rm$^{01}$ in Formula (Y1-0) include organic groups represented by Formulae (R$^0$-1) to (R$^0$-16). * represents a bonding site.

(R$^0$-1)

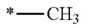

(R$^0$-2)

(R$^0$-3)

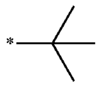

(R$^0$-4)

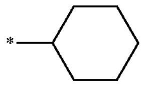

(R$^0$-5)

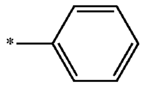

(R$^0$-6)

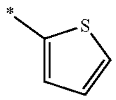

(R$^0$-7)

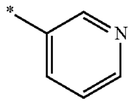

(R$^0$-8)

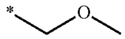

(R$^0$-9)

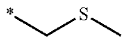

(R$^0$-10)

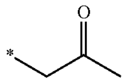

(R$^0$-11)

(R$^0$-12)

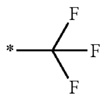

(R$^0$-13)

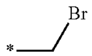

(R$^0$-14)

-continued (R$^0$-15)

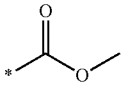

(R$^0$-16)

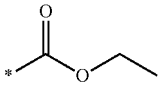

In Formula (Y1-0), m represents an integer in a range of 1 to 4. In a case where m represents an integer of 2 or more, a plurality of Rm$^{01}$'s may be the same or different from each other.

m represents an integer in a range of 1 to 4, and it is preferably an integer in a range of 1 to 3, more preferably 1 or 2, and still more preferably 1.

In Formula (Y1-0), An 01 represents an anion group. The anion group as An$^{01}$ represents a functional group containing a negatively charged atom.

Specific examples of the anion group as An$^{01}$ include anion groups represented by Formulae (an-1) to (an-15). * represents a bonding site.

(an-1)

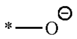

(an-2)

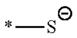

(an-3)

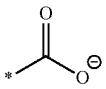

(an-4)

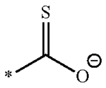

(an-5)

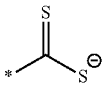

(an-6)

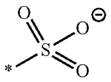

(an-7)

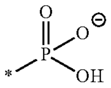

(an-8)

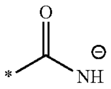

(an-9)

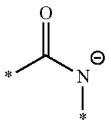

(an-10)

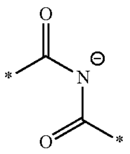

-continued (an-11)

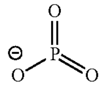

(an-12)

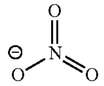

(an-13)

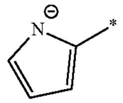

(an-14)

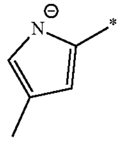

(an-15)

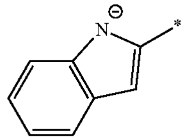

Among the above, the anion group as $An^{01}$ is preferably an anion group containing $N^-$ or C(═O)—$O^-$, and more preferably an anion group represented by any of Formulae (an-3) and (an-13) to (an-15).

In Formula (Y1-0), n represents an integer in a range of 1 to 4. In a case where n represents an integer of 2 or more, a plurality of $An^{01}$'s may be the same or different from each other.

m represents an integer in a range of 1 to 4, and it is preferably an integer in a range of 1 to 3, more preferably 1 or 2, and still more preferably 1.

Preferred specific examples of the bonder represented by Formula (Y1-0) are shown below.

(Y1-1)

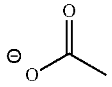

(Y1-2)

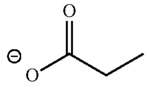

(Y1-3)

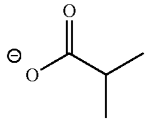

(Y1-4)

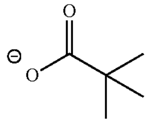

-continued (Y1-5)

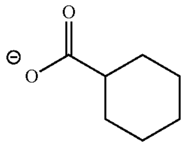

(Y1-6)

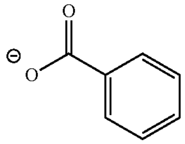

(Y1-7)

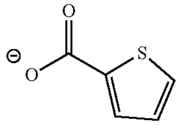

(Y1-8)

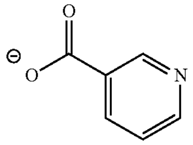

(Y1-9)

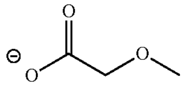

(Y1-10)

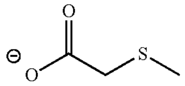

(Y1-11)

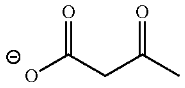

(Y1-12)

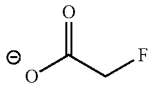

(Y1-13)

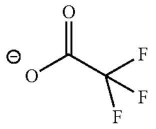

(Y1-14)

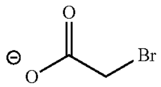

(Y1-15)

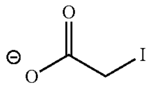

(Y1-15)

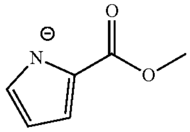

-continued (Y1-16)

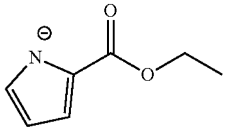

(Y1-17)

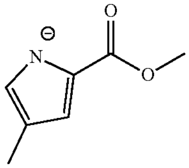

(Y1-18)

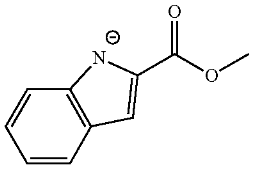

Among the above, the bonder represented by Formula (Y1-0) is preferably a bonder represented by Formula (Y1-1), (Y1-7), or (Y1-15).

Bonder Represented by Formula (Y2-0)

Examples of the bonder that is bonded to a metal atom include a bonder represented by Formula (Y2-0). The bonder represented by Formula (Y2-0) is a bonder that forms a coordinate bond or a covalent bond to a metal atom.

$Rm^{02}$ (Y2-0)

[In the formula, $Rm^{02}$ represents an organic group.]

In Formula (Y2-0), $Rm^{02}$ represents an organic group. Examples of the organic group include the same one as the organic group as $Rm^{01}$ in Formula (Y1-0).

Among the above, $Rm^{02}$ is preferably an organic group having a nitrogen atom or an aromatic hydrocarbon group.

Preferred specific examples of the bonder represented by Formula (Y2-0) are shown below. It is noted that the bonders represented by Formulae (Y2-1) to (Y2-20) are each a bonder that forms a coordinate bond to a metal atom. The bonders represented by Formulae (Y2-21) to (Y2-24) are each a bonder that forms a covalent bond to a metal atom.

(Y2-1)

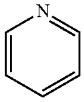

(Y2-2)

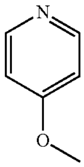

(Y2-3)

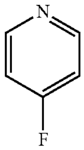

-continued (Y2-4)

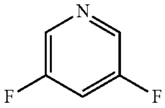

(Y2-5)

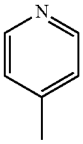

(Y2-6)

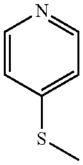

(Y2-7)

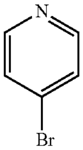

(Y2-8)

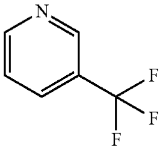

(Y2-9)

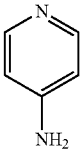

(Y2-10)

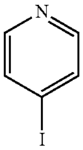

(Y2-11)

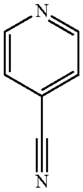

$NH_3$ (Y2-12)

(Y2-13)

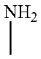

(Y2-14)

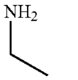

(Y2-15)

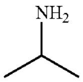

-continued (Y2-16)

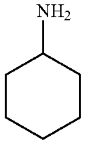

(Y2-17)

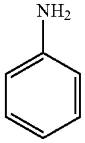

(Y2-18)

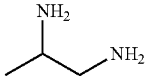

(Y2-19)

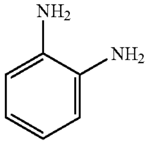

(Y2-20)

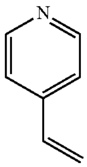

(Y2-21)

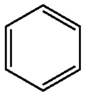

(Y2-22)

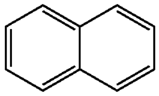

(Y2-23)

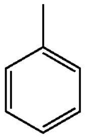

(Y2-24)

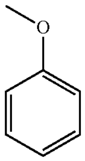

Among the above, the bonder represented by Formula (Y2-0) is preferably a nitrogen-containing compound such as ammonia, an aliphatic amine, a mixed amine, an aromatic amine, or a heterocyclic amine, or benzene, naphthalene, or an aromatic compound consisting of a derivative thereof, and more preferably a bonder represented by Formula (Y2-1) or (Y2-21).

Among the above, the bonder that is bonded to a metal atom is preferably $H_2O$, a hydroxide ion ($OH^-$), a bonder represented by Formula (Y1-0), or a bonder represented by Formula (Y2-0), and more preferably $H_2O$, a hydroxide ion ($OH^-$), a bonder represented by Formula (Y1-1), (Y1-7), or (Y1-15), or a bonder represented by Formula (Y2-1) or (Y2-21).

In General Formula (m-0), X represents an oxygen atom and may contain a bonder that is bonded to the oxygen atom.

The oxygen atom as X may be an oxide ion.

[Bonder that is Bonded to Oxygen Atom]

Examples of the bonder that is bonded to an oxygen atom include a bonder represented by Formula (Z1-0).

$Rz^{01}$ (Z1-0)

[In the Formula, $Rz^{01}$ Represents a Hydrogen Atom or an Organic Group.]

In Formula (Z1-0), examples of the organic group as $Rz^{01}$ include the same one as the organic group as $Rm^{01}$ in Formula (Y1-0).

Preferred specific examples of the bonder represented by Formula (Z1-0) are shown below. * represents a bonding site to an oxygen atom.

(Z-1)

*—$CH_3$ (Z-2)

(Z-3)

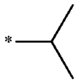

(Z-4)

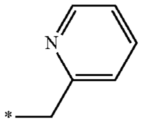

(Z-5)

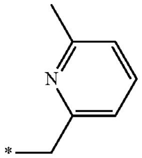

(Z-6)

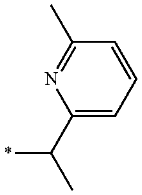

(Z-7)

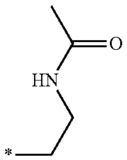

(Z-8)

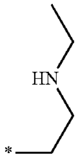

(Z-9)

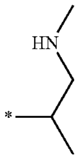

-continued
(Z-10)
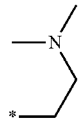
(Z-11)
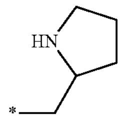
(Z-12)
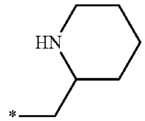
(Z-13)
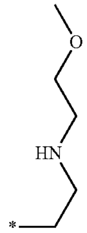
(Z-14)
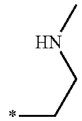
Preferred specific examples of X in General Formula (m-0) are shown below.
(X-1)
(X-2)
(X-3)
(X-4)
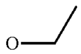
(X-5)
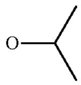
(X-6)
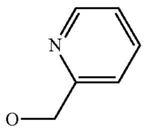
(X-7)
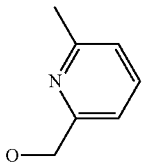
-continued
(X-8)
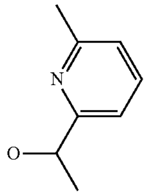
(X-9)
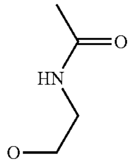
(X-10)
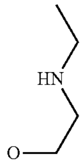
(X-11)
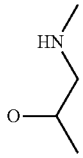
(X-12)
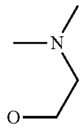
(X-13)
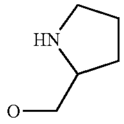
(X-14)
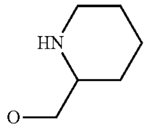
(X-15)
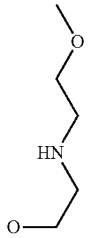
(X-16)
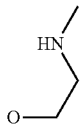
Among the above, X in General Formula (m-0) is preferably an oxygen atom, OH, an organic group represented by Formula (X-3), or an organic group represented by Formula (X-4).

In General Formula (m-0), M may be bonded to X through a bonder.

An example of a case where M is bonded to X through a bonder is shown below. * represents a bonding site.

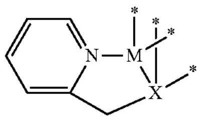

Specific examples of the component (M1) include a compound represented by Formula (m-0), where it is a compound in which the metal atom as M in the formula is In, Te, Ni, Co, W, Bi, Pb, Sb, Pd, Zn, Hf, Ge, Ga, Cr, or Mn, the bonder that is bonded to a metal atom is one or more kinds of bonders selected from the group consisting of $H_2O$, a hydroxide ion ($OH^-$), a bonder represented by Formula (Y1-0), and bonders represented by Formula (Y2-1) to (Y2-20), and X in the formula is one or more atoms or molecules selected from the group consisting of an oxygen atom, OH, and organic groups represented by Formulae (X-3) to (X-16).

In addition, examples thereof include a compound represented by Formula (m-0), where it is a compound in which the metal atom as M in the formula is Sn, the bonder that is bonded to a metal atom is one or more kinds of bonders selected from the group consisting of $H_2O$, a hydroxide ion ($OH^-$), a bonder represented by Formula (Y1-0), and bonders represented by Formula (Y2-21) to (Y2-24), and X in the formula is one or more atoms or molecules selected from the group consisting of an oxygen atom, OH, and organic groups represented by Formulae (X-3) to (X-16).

Suitable specific examples of the component (M1) are shown below.

(M1-1)

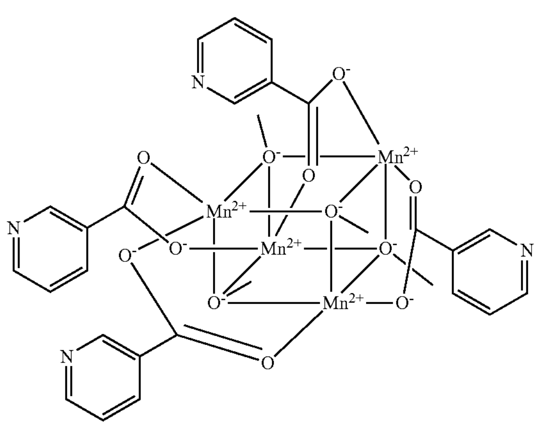

CAS: 1410685-24-3

-continued (M1-2)

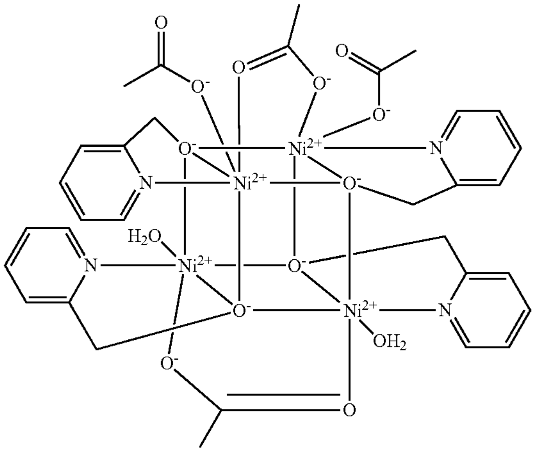

CAS: 1197838-19-9

(M1-3)

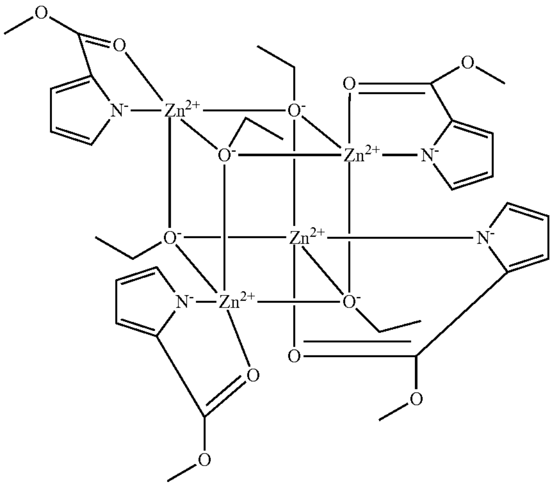

CAS: 2135442-09-8

(M1-4)

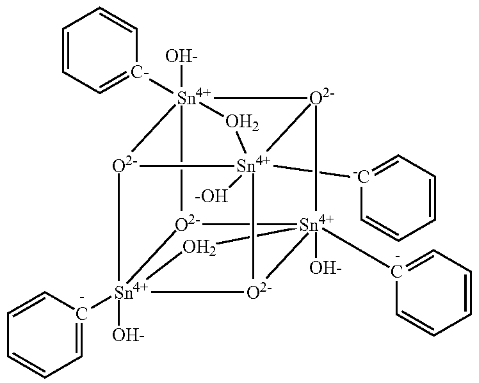

CAS: 350494-45-0

-continued (M1-5)

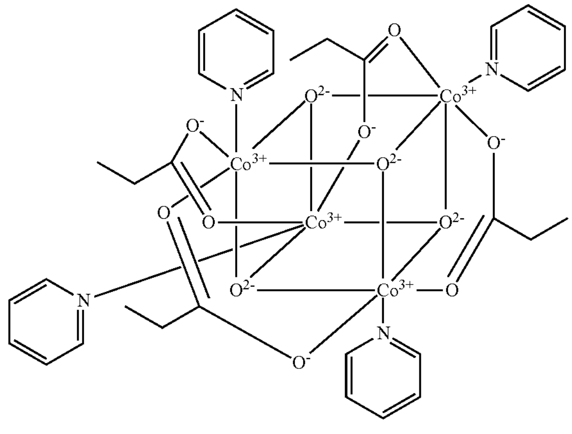

CAS: 2108093-85-0

In the resist composition according to the present embodiment, the component (M1) may be used alone or in a combination of two or more kinds thereof.

The content of the component (M1) is preferably in a range of 1% to 10% by mass, more preferably in a range of 1% to 8% by mass, and still more preferably in a range of 1% to 5% by mass with respect to 100% by mass of the total amount of the resist composition.

In a case of setting the content of the component (M1) within the above-described preferred range, it is possible to achieve high sensitivity and reduce roughness and scum.

[Production Method for Component (M1)]

The component (M1) can be synthesized, for example, by methods described in papers, (Eur. J. Inorg. Chem., 2012, 4029-4035), (Polyhedron, 2009, 28, 3373-3381), (Chem. Commun., 2017, 53, 10808-10811), (MRS Online Proceedings Library, 2000, 628 (12)), and (Angew. Chem. Int. Ed., 2017, 56, 6911-6915).

For example, it can be produced by reacting a metal hydrate capable of forming a cubane-type structure with a carboxylic acid or a nitrogen-containing compound for a long time.

<Other Components>

The resist composition according to the present embodiment may further contain other components in addition to the metal compound (M) described above. Examples of the other components include an organic solvent component (S) and an additive (X) shown below.

<<Organic Solvent Component (S)>>

The resist composition according to the present embodiment may be produced by dissolving the resist materials in an organic solvent component (hereinafter, referred to as a "component (S)").

The component (S) may be any organic solvent that can dissolve or disperse the respective components to be used to obtain a homogeneous solution or a dispersion liquid, and optional organic solvent can be appropriately selected and used from those which are known as solvents for a resist composition in the related art.

Examples of the component (S) include lactones such as γ-butyrolactone; ketones such as acetone, methyl ethyl ketone, cyclohexanone, methyl-n-pentyl ketone, and methyl isopentyl ketone, 2-heptanone; monoalcohols such as methanol, ethanol, n-propanol, isopropanol, n-butanol, sec-butanol, t-butanol, n-pentanol, 4-methyl-2-pentanol, and 2-methylbutyl alcohol; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether (such as monomethyl ether, monoethyl ether, monopropyl ether or monobutyl ether) or monophenyl ether of any of these polyhydric alcohols or compounds having an ester bond [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene and mesitylene; and dimethylsulfoxide (DMSO).

In the resist composition according to the present embodiment, the component (S) may be used alone or as a mixed solvent of two or more kinds thereof.

Among the above, the component (S) is preferably PGMEA, PGME, γ-butyrolactone, EL, cyclohexanone, or 4-methyl-2-pentanol, and more preferably PGME.

Further, a mixed solvent obtained by mixing PGMEA with a polar solvent is also preferable as the component (S). The blending ratio (in terms of mass ratio) of the mixed solvent may be appropriately determined, taking into consideration the compatibility of the PGMEA with the polar solvent, but is preferably in a range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME, and cyclohexanone is also preferable.

Further, the component (S) is also preferably a mixed solvent of at least one selected from PGMEA and EL and γ-butyrolactone. In this case, as the mixing ratio, the mass ratio of the former to the latter is preferably in a range of 70:30 to 95:5.

The amount of the component (S) to be used is not particularly limited and is appropriately set, depending on the coating film thickness, to a concentration at which the component (S) can be applied onto a substrate or the like. Generally, the component (S) is used such that the solid content concentration of the resist composition is in a range of 0.1% to 20% by mass, preferably in a range of 0.2% to 15% by mass, more preferably in a range of 1% to 10% by mass, and still more preferably in a range of 1% to 5% by mass.

After dissolving the resist material in the component (S), the resist composition according to the present embodiment may be subjected to the removal of impurities and the like by using a porous polyimide membrane, a porous polyamide-imide membrane, or the like. For example, the resist composition may be filtered using a filter consisting of a porous polyimide membrane, a filter consisting of a porous polyamide-imide membrane, or a filter consisting of a porous polyimide membrane and a porous polyamide-imide membrane. Examples of the porous polyimide membrane and the porous polyamide-imide membrane include those described in Japanese Unexamined Patent Application, First Publication No. 2016-155121.

<<Additive (X)>>

The resist composition according to the present embodiment may contain an additive (X) (hereinafter, referred to as a "component (X)").

Examples of the component (X) include a crosslinking accelerator and a surfactant.

[Crosslinking Accelerator]

The resist composition according to the present embodiment may contain a crosslinking accelerator. A crosslinking accelerator is a compound that generates acid or base by light or heat. In a case where a crosslinking accelerator is contained, resist pattern forming properties and etching selectivity can be improved.

Examples of the crosslinking accelerator include an onium salt compound and an N-sulfonyloxyimide compound. The crosslinking accelerator is preferably a thermal crosslinking accelerator that generates acid or a base by heat, and an onium salt compound is particularly preferable.

Examples of the onium salt compound include a sulfonium salt, a tetrahydrothiophenium salt, an iodonium salt, and an ammonium salt.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and triphenylsulfonium 1,1,2,2-tetrafluoro-6-(1-adamantancarbonyloxy)-hexane-1-sulfonate.

Examples of the tetrahydrothiophenium salt include 1-(4-n-butoxynaphthalene-1-yl)tetrahydrothiophenium trifluoromethanesulfonate, 1-(4-n-butoxynaphthalene-1-yl)tetrahydrothiophenium nonafluoro-n-butanesulfonate, 1-(4-n-butoxynaphthalene-1-yl)tetrahydrothiophenium perfluoro-n-octanesulfonate, 1-(4-n-butoxynaphthalene-1-yl)tetrahydrothiophenium 2-bicyclo[2.2.1]hept-2-yl-1,1,2,2-tetrafluoroethanesulfonate, 1-(6-n-butoxynaphthalene-2-yl)tetrahydrothiophenium trifluoromethanesulfonate, 1-(6-n-butoxynaphthalene-2-yl)tetrahydrothiophenium nonafluoro-n-butanesulfonate, 1-(6-n-butoxynaphthalene-2-yl)tetrahydrothiophenium perfluoro-n-octanesulfonate, 1-(6-n-butoxynaphthalene-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, and 1-(3,5-dimethyl-4-hydroxyphenyl)tetrahydrothiophenium 2-bicyclo[2.2.1]hept-2-yl-1,1,2,2-tetrafluoroethanesulfonate.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, and bis(4-t-butylphenyl)iodonium 2-bicyclo[2.2.1]hept-2-yl-1,1,2,2-tetrafluoroethanesulfonate.

Examples of the ammonium salt include ammonium formate, ammonium maleate, ammonium fumarate, ammonium phthalate, ammonium malonate, ammonium succinate, ammonium tartrate, ammonium malate, ammonium lactate, ammonium citrate, ammonium acetate, ammonium propionate, ammonium butanoate, ammonium pentanoate, ammonium hexanoate, ammonium heptanoate, ammonium octanoate, ammonium nonanoate, ammonium decanoate, ammonium oxalate, ammonium adipate, ammonium sebacate, ammonium butyrate, ammonium oleate, ammonium stearate, ammonium linoleate, ammonium linolenate, ammonium salicylate, ammonium benzenesulfonate, ammonium benzoate, ammonium p-aminobenzoate, ammonium p-toluenesulfonate, ammonium methanesulfonate, ammonium trifluoromethanesulfonate, and ammonium trifluoroethanesulfonate. In addition, examples thereof include an ammonium salt in which the ammonium ion of the above ammonium salt is substituted with a methylammonium ion, a dimethylammonium ion, a trimethylammonium ion, a tetramethylammonium ion, an ethylammonium ion, a diethylammonium ion, a triethylammonium ion, a tetraethylammonium ion, a propylammonium ion, a dipropylammonium ion, a tripropylammonium ion, a tetrapropylammonium ion, a butylammonium ion, a dibutylammonium ion, a tributylammonium ion, a tetrabutylammonium ion, a trimethylethylammonium ion, a dimethyldiethylammonium ion, a dimethylethylpropylammonium ion, a methylethylpropylbutylammonium ion, an ethanolammonium ion, a diethanolammonium ion, or a triethanolammonium ion; a 1,8-diazabicyclo[5.4.0]undec-7-ene salt such as a 1,8-diazabicyclo[5.4.0]undec-7-ene formic acid salt or a 1,8-diazabicyclo[5.4.0]undec-7-ene p-toluenesulfonic acid salt; and a 1,5-diazabicyclo[4.3.0]-5-nonene salt such as a 1,5-diazabicyclo[4.3.0]-5-nonene formic acid salt or a 1,5-diazabicyclo[4.3.0]-5-nonene p-toluenesulfonate.

Examples of the N-sulfonyloxyimide compound include N-(trifluoromethanesulfonyloxy)bicyclo[2.2.1]hept-5-en-2,3-dicarboxyimide, N-(nonafluoro-n-butanesulfonyloxy)bicyclo[2.2.1]hept-5-en-2,3-dicarboxyimide, N-(perfluoro-n-octanesulfonyloxy)bicyclo[2.2.1]hept-5-en-2,3-dicarboxyimide, and N-(2-bicyclo[2.2.1]hept-2-yl-1,1,2,2-tetrafluoroethanesulfonyloxy)bicyclo[2.2.1]hept-5-en-2,3-dicarboxyimide.

Among them, an onium salt compound is preferable, a tetrahydrothiophenium salt, an iodonium salt, or an ammonium salt is more preferable, and 1-(4-n-butoxynaphthalene-1-yl)tetrahydrothiophenium trifluoromethanesulfonate, diphenyliodonium trifluoromethanesulfonate, tetramethylammonium acetate, or a 1,8-diazabicyclo[5.4.0]undec-7-ene p-toluenesulfonic acid salt is still more preferable.

The crosslinking accelerator may be used alone, or two or more kinds thereof may be used in combination. The content of the crosslinking accelerator is preferably 0 parts by mass or more and 10 parts by mass or less, and more preferably 0 parts by mass or more and 5 parts by mass or less, with respect to 100 parts by mass of the component (M).

[Surfactant]

The resist composition according to the present embodiment may contain a surfactant.

The surfactant is a component that exhibits effects of improving coatability, striation. In addition to nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, examples of the surfactant include, as the following product names, KP341 (Shin-Etsu Chemical Co., Ltd.); Polyflow No. 75 and Polyflow No. 95 (all manufactured by Kyoeisha Chemical Co., Ltd.); Eftop EF301, Eftop EF303, and Eftop EF352 (all manufactured by Tochem Products Co., Ltd.); MEGAFACE F171, MEGAFACE F173 (all manufactured by DIC Corporation); Florard FC430 and Florard FC431 (all manufactured by Sumitomo 3M Limited); and AsahiGuard AG710, Surflon S-382, Surflon SC-101, Surflon SC-102, Surflon SC-103, Surflon SC-104, Surflon SC-105, and Surflon SC-106 (all manufactured by AGC Inc.).

The surfactant may be used alone, or two or more kinds thereof may be used in combination. The blending amount of the surfactant can be appropriately determined depending on the intended purpose.

The resist composition according to the present embodiment may contain an additive other than the crosslinking accelerator and the surfactant. Examples of the other additive include, but are not limited to, the following compounds.

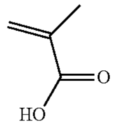

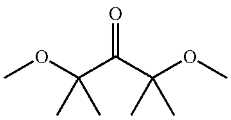

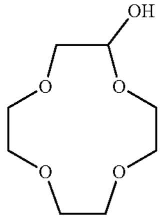

As desired, other miscible additives can also be added to the resist composition according to the present embodiment. For example, for improving the performance of the resist film, an additive resin, a dissolution inhibitor, a plasticizer, a stabilizer, a colorant, a halation prevention agent, and a dye can be appropriately contained therein.

The resist composition according to the present embodiment, which is described above, contains a cubane-structured metal oxide.

Since the cubane-structured metal oxide has a metal atom, the absorption amount of EUV light is large. In addition, since the cubane-structured metal oxide has a cubic skeleton, the solubility in a developing solution (an organic solvent) is relatively high.

As a result, according to the resist composition according to the present embodiment, it is possible to achieve high sensitivity, reduce roughness, and reduce scum.

(Method for Forming Resist Pattern)

The method for forming a resist pattern according to the second aspect of the present invention includes a step of forming a resist film on a support using the resist composition according to the embodiment described above, a step of exposing the resist film, and a step of developing the exposed resist film to form a resist pattern. Examples of one embodiment of such a method for forming a resist pattern include a method for forming a resist pattern carried out as described below.

First, the resist composition of the above-described embodiment is applied onto a support with a spinner or the like, and a baking (post-apply baking (PAB)) treatment is carried out, for example, at a temperature condition in a range of 80° C. to 150° C. for 40 to 120 seconds, preferably for 60 to 90 seconds to form a resist film.

Next, the resist film is subjected to exposure through a mask (a mask pattern) having a predetermined pattern formed on a mask by using an exposure apparatus such as an electron beam drawing apparatus or an EUV exposure apparatus, or selective exposure by direct irradiation with an electron beam for drawing without using a mask pattern, and then baking treatment (post-exposure baking (PEB)) is carried out, for example, under a temperature condition in a range of 80° C. to 150° C. for 40 to 120 seconds and preferably 60 to 90 seconds.

Next, the resist film is subjected to a developing treatment. The developing treatment is carried out using an alkali developing solution in a case of an alkali developing process, and a developing solution containing an organic solvent (organic developing solution) in a case of a solvent developing process. The developing treatment is usually carried out by a solvent developing process.

After the developing treatment, it is preferable to carry out a rinse treatment. As the rinse treatment, water rinsing using pure water is preferable in a case of an alkali developing process, and rinsing using a rinse liquid containing an organic solvent is preferable in a case of a solvent developing process.

In a case of a solvent developing process, after the developing treatment or the rinse treatment, the developing solution or the rinse liquid remaining on the pattern may be removed by a treatment using a supercritical fluid.

After the developing treatment or the rinse treatment, drying is conducted. As desired, baking treatment (post-baking) may be carried out following the developing treatment.

In this manner, a resist pattern can be formed.

The support is not specifically limited and a conventionally known support in the related art can be used. For example, substrates for electronic components, and such substrates having a predetermined wiring pattern formed thereon can be used. More specific examples thereof include a silicon wafer, a substrate made of a metal such as copper, chromium, iron, or aluminum; and a glass substrate. Suitable examples of the material for a wiring pattern include copper, aluminum, nickel, and gold.

In addition, the support may be a support having an inorganic and/or organic film provided on such a substrate as described above. Examples of the inorganic film include an inorganic antireflection film (an inorganic BARC). Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having three or more layers consisting of an upper-layer resist film, a lower-layer organic film and one or more intermediate layers (thin metal film or the like) provided between the upper-layer resist film and the lower-layer organic film (triple-layer resist method).

The wavelength to be used for exposure is not particularly limited and the exposure can be carried out using radiation such as an ArF excimer laser, a KrF excimer laser, an F2 excimer laser, an extreme ultraviolet ray (EUV), a vacuum ultraviolet ray (VUV), an electron beam (EB), an X-ray, or a soft X-ray. The resist composition is highly useful for a KrF excimer laser, an ArF excimer laser, EB, or EUV, more useful for an ArF excimer laser, EB or EUV, and particularly useful for EB or EUV. That is, the method for forming a resist pattern according to the present embodiment is a method particularly useful in a case where the step of exposing the resist film includes an operation of exposing the resist film to an extreme ultraviolet ray (EUV) or an electron beam (EB).

The exposure method for a resist film may be a general exposure (dry exposure) carried out in air or an inert gas such as nitrogen, or liquid immersion lithography.

The liquid immersion lithography is an exposure method in which the region between the resist film and the lens at the lowermost position of the exposure apparatus is pre-filled with a solvent (liquid immersion medium) that has a larger refractive index than the refractive index of air, and the exposure (immersion exposure) is carried out in this state.

The liquid immersion medium is preferably a solvent that exhibits a refractive index larger than the refractive index of air but smaller than the refractive index of the resist film to be exposed. The refractive index of the solvent is not particularly limited as long as it satisfies the above-described requirements.

Examples of the solvent which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$, or $C_5H_3F_7$ as the main component, and the boiling point is preferably in a range of 70° C. to 180° C. and more preferably in a range of 80° C. to 160° C. A fluorine-based inert liquid having a boiling point in the above-described range is advantageous in that removing the medium used in the liquid immersion after the exposure can be preferably carried out by a simple method.

The fluorine-based inert liquid is particularly preferably a perfluoroalkyl compound obtained by substituting all hydrogen atoms of an alkyl group with a fluorine atom. Specific examples of the perfluoroalkyl compound include a perfluoroalkyl ether compound and a perfluoroalkyl amine compound.

In addition, specifically, examples of the perfluoroalkyl ether compound include perfluoro(2-butyl-tetrahydrofuran) (boiling point of 102° C.), and examples of the perfluoroalkyl amine compound include perfluorotributyl amine (boiling point of 174° C.).

As the liquid immersion medium, water is preferable in terms of cost, safety, environment, and versatility.

Examples of the alkali developing solution used for a developing treatment in an alkali developing process include a 0.1% to 10% by mass aqueous solution of tetramethylammonium hydroxide (TMAH).

As the organic solvent contained in the organic developing solution, which is used for a developing treatment in a solvent developing process, any organic solvent capable of dissolving the component (A) (the component (A) prior to exposure) may be appropriately selected from the conventionally known organic solvents. Specific examples of the organic solvent include polar solvents such as a ketone-based solvent, an ester-based solvent, an alcohol-based solvent, a nitrile-based solvent, an amide-based solvent, and an ether-based solvent, and hydrocarbon-based solvents.

The ketone-based solvent is an organic solvent containing C—C(═O)—C in the structure thereof. The ester-based solvent is an organic solvent containing C—C(═O)—O—C in the structure thereof. The alcohol-based solvent is an organic solvent containing an alcoholic hydroxyl group in the structure thereof. The "alcoholic hydroxyl group" indicates a hydroxyl group bonded to a carbon atom of an aliphatic hydrocarbon group. The nitrile-based solvent is an organic solvent containing a nitrile group in the structure thereof. The amide-based solvent is an organic solvent containing an amide group in the structure thereof. The ether-based solvent is an organic solvent containing C—O—C in the structure thereof.

Among the organic solvents, an organic solvent having in the structure thereof, a plurality of kinds of functional groups each of which characterize the above-described solvents, is also present. In such a case, the organic solvent can be classified as any type of solvents containing the functional groups contained in the organic solvent. For example, diethylene glycol monomethyl ether can be classified as an alcohol-based solvent or an ether-based solvent.

A hydrocarbon-based solvent consists of a hydrocarbon which may be halogenated and is a hydrocarbon solvent does not have any substituent other than a halogen atom. Examples of the halogen atom include a fluorine atom, a chlorine atom, a bromine atom, and an iodine atom, and a fluorine atom is preferable.

Among the above, the organic solvent contained in the organic developing solution is preferably a polar solvent and more preferably a ketone-based solvent, an ester-based solvent, or a nitrile-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonyl acetone, ionone, diacetonyl alcohol, acetylcarbinol, acetophenone, methyl naphthyl ketone, isophorone, propylene carbonate, γ-butyrolactone, and methylamyl ketone (2-heptanone). Among these examples, the ketone-based solvent is preferably methylamyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, the ester-based solvent is preferably butyl acetate.

Examples of the nitrile-based solvent include acetonitrile, propionitrile, valeronitrile, and butyronitrile.

As desired, the organic developing solution may have a conventionally known additive blended. Examples of the additive include surfactants. The surfactant is not particularly limited, and for example, an ionic or non-ionic fluorine-based and/or a silicon-based surfactant can be used. The surfactant is preferably a non-ionic surfactant and more preferably a non-ionic fluorine-based surfactant or a non-ionic silicon-based surfactant.

In a case where a surfactant is blended, the blending amount thereof is typically in a range of 0.001% to 5% by mass, preferably in a range of 0.005% to 2% by mass, and more preferably in a range of 0.01% to 0.5% by mass with respect to the total amount of the organic developing solution.

The developing treatment can be carried out by a conventionally known developing method. Examples thereof include a method in which the support is immersed in the developing solution for a predetermined period (a dip method), a method in which the developing solution is cast upon the surface of the support by surface tension and maintained for a predetermined period (a puddle method), a method in which the developing solution is sprayed onto the surface of the support (spray method), and a method in which a developing solution is continuously ejected from a developing solution ejecting nozzle and applied onto a support which is scanned at a constant rate while being rotated at a constant rate (dynamic dispense method).

As the organic solvent contained in the rinse liquid used in the rinse treatment after the developing treatment in a case of a solvent developing process, an organic solvent hardly dissolving the resist pattern can be appropriately selected and used, among the organic solvents mentioned as organic solvents that are used for the organic developing solution. In general, at least one kind of solvent selected from a hydrocarbon-based solvent, a ketone-based solvent, an ester-based solvent, an alcohol-based solvent, an amide-based solvent, and an ether-based solvent is used. Among these, at least one kind of solvent selected from a hydrocarbon-based solvent, a ketone-based solvent, an ester-based solvent, an alcohol-based solvent, and an amide-based solvent is preferable, at least one kind of solvent selected from an alcohol-based solvent and an ester-based solvent is more preferable, and an alcohol-based solvent is particularly preferable.

The alcohol-based solvent used for the rinse liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed thereto. However, in consideration of the development characteristics, the blending amount of water in the rinse liquid is preferably 30% by mass or less, more preferably 10% by mass or less, still more preferably 5% by mass or less, and particularly preferably 3% by mass or less with respect to the total amount of the rinse liquid.

A conventionally known additive can be blended with the rinse liquid as necessary. Examples of the additive include surfactants. Examples of the surfactant include the same ones as those described above, the surfactant is preferably a non-ionic surfactant and more preferably a non-ionic fluorine-based surfactant or a non-ionic silicon-based surfactant.

In a case where a surfactant is blended, the blending amount thereof is typically in a range of 0.001% to 5% by mass, preferably in a range of 0.005% to 2% by mass, and more preferably in a range of 0.01% to 0.5% by mass with respect to the total amount of the rinse liquid.

The rinse treatment using a rinse liquid (washing treatment) can be carried out by a conventionally known rinse method. Examples of the rinse treatment method include a method in which the rinse liquid is continuously ejected and applied onto the support while rotating it at a constant rate (rotational coating method), a method in which the support is immersed in the rinse liquid for a predetermined period (dip method), and a method in which the rinse liquid is sprayed onto the surface of the support (spray method).

According to the method for forming a resist pattern according to the present embodiment described above, since the resist composition according to the first aspect described above is used, it is possible to achieve high sensitivity and reduce roughness and scum.

EXAMPLES

Hereinafter, the present invention will be described in more detail based on Examples, but the present invention is not limited to these Examples.

<Production of Metal Compound>

Production Example 1: Cubane-Structured Metal Oxide (M1-1)

A cubane-structured metal oxide (M1-1) was synthesized according to a production method described in a paper (Eur. J. Inorg. Chem., 2012, 4029-4035).

Specifically, manganese (II) perchlorate hexahydrate (0.90 mg) and nicotinic acid (0.62 g) were added to a mixed solution (70 mL) of acetonitrile and methanol having a volume ratio of 4:3, followed by heating to 160° C. over 4 hours. After holding at this temperature for 2 days, the mixture was cooled to room temperature and further held for 2 days. Then, the product was sufficiently washed with alcohol and dried at room temperature to synthesize a cubane-structured metal oxide (M1-1) represented by Formula (M1-1).

(M1-1)

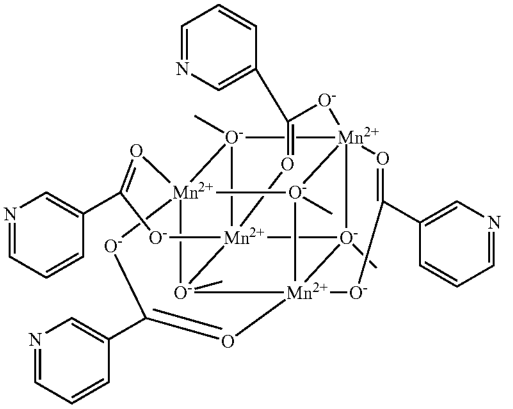

CAS: 1410658-24-3

Production Example 2: Cubane-Structured Metal Oxide (M1-2)

A cubane-structured metal oxide (M1-2) was synthesized according to a production method described in a paper (Polyhedron, 2009, 28, 3373-3381).

Specifically, 2-hydroxymethylpyridine (0.57 mL) was added to an aqueous solution (150 mL) of nickel (II) acetate tetrahydrate (1.58 g, 0.60 mmol). The solution was stirred for 15 minutes, mixed with 1,4-dioxane (10 mL), and allowed to stand at room temperature for 4 days. The product was collected by filtration, washed with acetone, and dried in the air to synthesize a cubane-structured metal oxide (M1-2) represented by Formula (M1-2).

(M1-2)

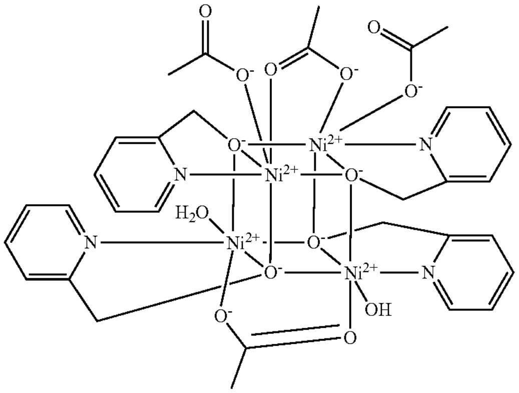

CAS: 1197838-19-9

Production Example 3: Cubane-Structured Metal Oxide (M1-3)

A cubane-structured metal oxide (M1-3) was synthesized according to a production method described in a paper (Chem. Commun., 2017, 53, 10808-10811).

Specifically, pyrrole-2-carboxyaldehyde (1.0 g) was added to toluene (50 mL) and cooled to −78° C. Diethyl zinc (4.1 mL) in a 2 M hexane solution was added dropwise thereto, the temperature was raised to room temperature, and the resultant mixture was stirred for 4 hours. Then, the solution was cooled to −20° C. and subjected to bubbling with dry oxygen. Further, the inside of the system was purged with nitrogen, thereby, after 24 hours, obtaining a cubane-structured metal oxide (M1-3) represented by Formula (M1-3) from the toluene solution at −20° C.

(M1-3)

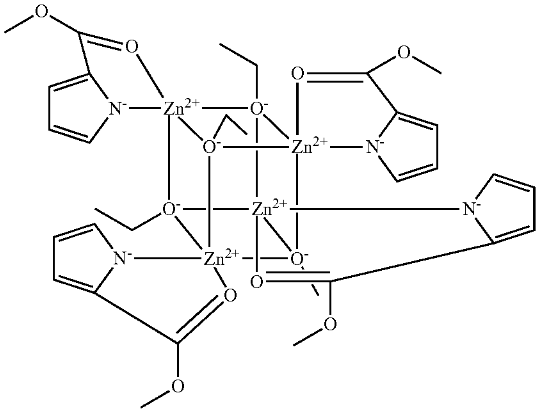

CAS: 2135442-09-8

Production Example 4: Cubane-Structured Metal Oxide (M1-4)

A cubane-structured metal oxide (M1-4) was synthesized according to a production method described in a paper (MRS Online Proceedings Library, 2000, 628 (12)).

Specifically, phenyltris(phenylethynyl) tin (3.0 g) was added to tetrahydrofuran (30 g), and 2 g of water was added dropwise thereto, followed by stirring overnight. Thereafter, the solvent was distilled off, and a residue (M1-4) was obtained.

A cubane-structured metal oxide (M1-4) represented by Formula (M1-4) was synthesized.

(M1-4)

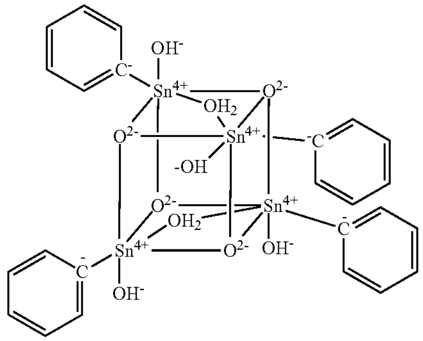

CAS: 350494-45-0

(M1-5)

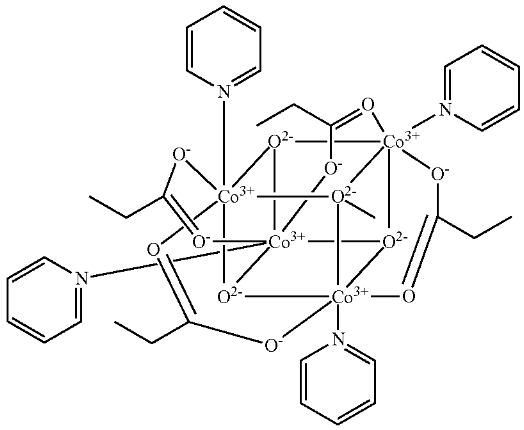

CAS: 2108093-85-0

Production Example 5: Cubane-Structured Metal Oxide (M1-5)

A cubane-structured metal oxide (M1-5) was synthesized according to a production method described in a paper (Angew. Chem. Int. Ed., 2017, 56, 6911-6915). Specifically, propionic acid (1.48 g) and sodium hydroxide (0.8 g) were stirred in methanol (30 mL) for 2 hours. Cobalt (II) nitrate hexahydrate (2.9 g) was added thereto, and the resultant mixture was heated and refluxed. Pyridine (0.8 g) was added to the refluxed solution, and hydrogen peroxide (5 mL, 30%) was added dropwise to the reaction solution. The reaction solution was stirred under the reflux condition for 4 hours and cooled to room temperature. Then, methanol was distilled off, the residue was extracted with dichloromethane three times, and the solvent was distilled off. The residue was purified by column chromatography to synthesize a cubane-structured metal oxide (M1-5) represented by Formula (M1-5).

Production Example 6: Metal Compound (M2-1)

A metal compound (M2-1) was synthesized according to a production method described in a paper (Proc. SPIE, 2014, 9051, 90511B-2 to 90511B-12).

Specifically, dodecabutyl hexa-μ-hydroxytetradeca-μ3-oxododeca tin hydroxide (1.0 g) was dissolved in tetrahydrofuran (10 mL). A solution (0.36 g) obtained by dissolving 10% by weight of acetaldehyde in tetrahydrofuran was added thereto, followed by stirring for 10 minutes. Then, the solvent was removed with a vacuum to obtain a metal compound (M2-1) represented by Formula (M2-1).

(M2-1)

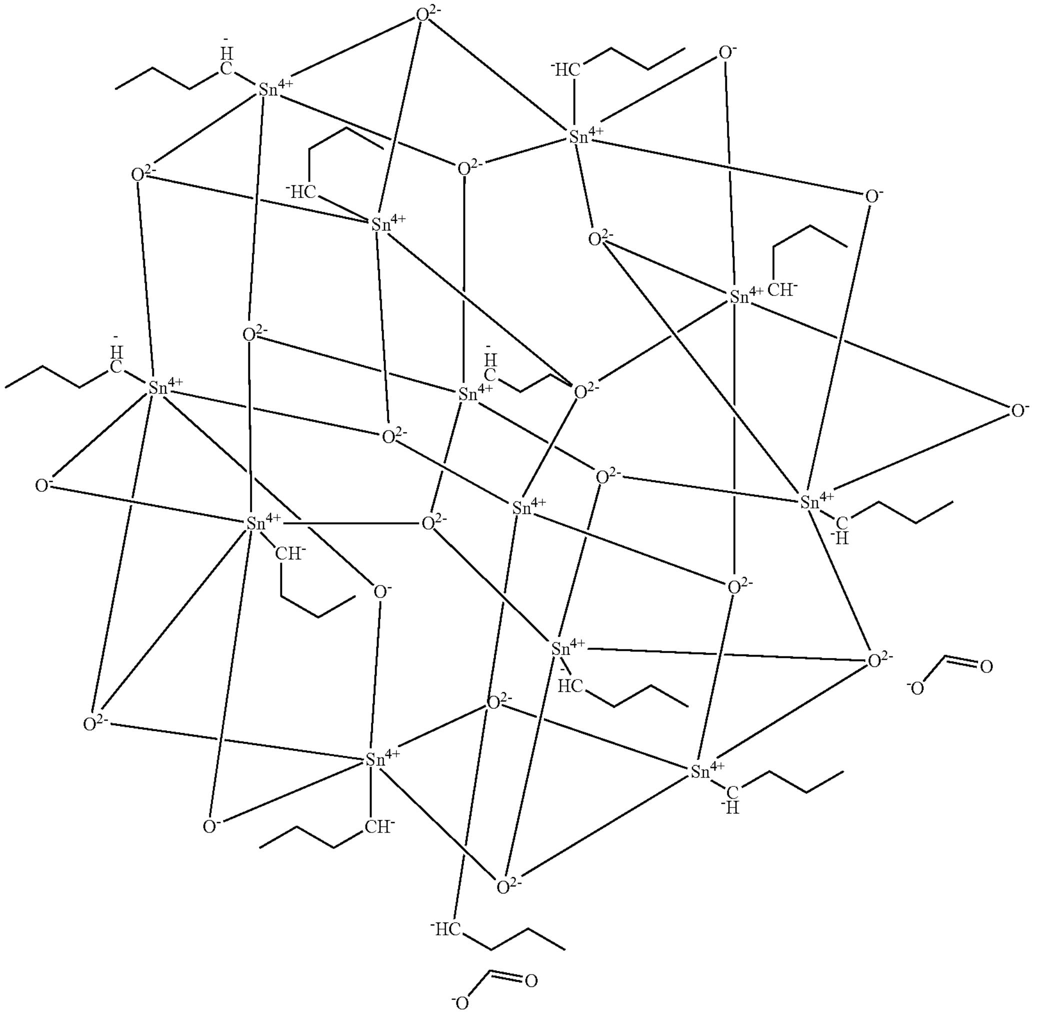

CAS : 215110-40-0

Production Example 7: Metal Compound (M2-2)

A metal compound (M2-2) was synthesized according to a production method described in Proc. SPIE, 2014, 9051, 90511B-2 to 90511B-12.

Specifically, dodecabutyl hexa-μ-hydroxytetradeca-μ3-oxododeca tin hydroxide (1.0 g) was dissolved in tetrahydrofuran (10 mL). A solution (1.0 g) obtained by dissolving 10% by weight of benzoic acid in tetrahydrofuran was added thereto, followed by stirring for 10 minutes. Then, the solvent was removed with a vacuum to obtain a metal compound (M2-2) represented by Formula (M2-2).

(M2-2)

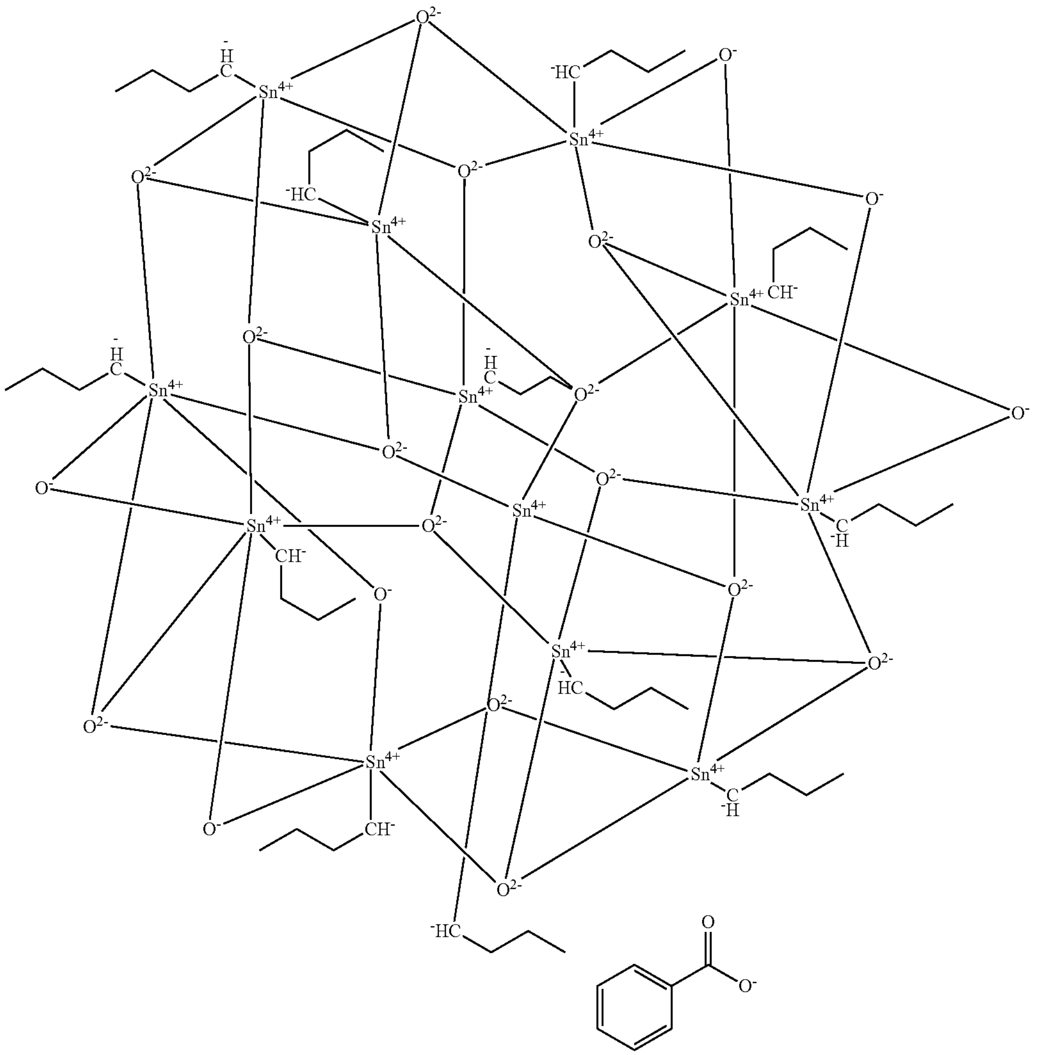

CAS : 1644182-81-9

Production Example 8: Metal Compound (M2-3)

A metal compound (M2-3) was synthesized according to a production method described in a paper (Chem. Ber. Red, 1997, 6, 473).

Specifically, 1 mL of a propanol solution of 70% zirconium (IV) propoxide and 1 mL of methacrylic acid were mixed in an inert atmosphere. After stirring for 5 minutes, the mixture was stored at room temperature for 14 days, and the product was dried in a vacuum for 12 hours to obtain a metal compound (M2-3) represented by Formula (M2-3).

(M2-3)

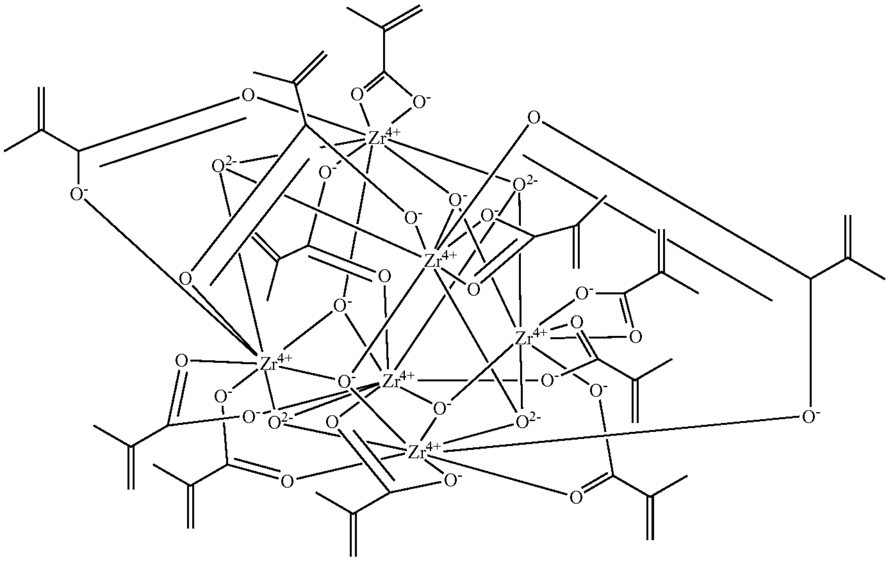

CASE: 189028-53-3

<Preparation of Resist Composition>

Examples 1 to 5 and Comparative Examples 1 to 3

Each of the components shown in Table 1 was mixed and dissolved to prepare a resist composition of each Example.

TABLE 1

| | Component (M) | Component (S) |
|---|---|---|
| Example 1 | (M1)-1 [3] | (S)-1 [97] |
| Example 2 | (M1)-2 [3] | (S)-1 [97] |
| Example 3 | (M1)-3 [3] | (S)-1 [97] |
| Example 4 | (M1)-4 [3] | (S)-1 [97] |
| Example 5 | (M1)-5 [3] | (S)-1 [97] |
| Comparative Example 1 | (M2)-1 [3] | (S)-1 [97] |
| Comparative Example 3 | (M2)-2 [3] | (S)-1 [97] |
| Comparative Example 2 | (M2)-3 [3] | (S)-1 [97] |

In Table 1, each abbreviation has the following meaning. The numerical value in the brackets is the blending amount (parts by mass).

(M1)-1 to (M1)-5: each of the above-described cubane-structured metal oxides (M1-1) to (M1-5).

(M2)-1 to (M2)-3: each of the above metal compounds (M2-1) to (M2-3).

(S)-1: propylene glycol monomethyl ether.

<Resist Pattern Formation>

The resist composition of each Example was applied onto an 8-inch silicon substrate which had been subjected to a hexamethyldisilazane (HMDS) treatment using a spinner, the coated wafer was subjected to a prebaking (PAB) treatment on a hot plate at a temperature of 80° C. for 60 seconds so that the coated wafer was dried to form a resist film having a film thickness of 40 nm.

Next, drawing (exposure) was carried out on the resist film by using an electron beam drawing apparatus JEOL-JBX-9300FS (manufactured by JEOL Ltd.) at an acceleration voltage of 100 kV, with the target size being set to a 1:1 line-and-space pattern (hereinafter, referred to as an "LS pattern") having a line width of 50 nm and a pitch of 100 nm, and the post-exposure baking (PEB) treatment was carried out at 130° C. for 60 seconds.

Next, solvent developing was carried out with butyl acetate at 23° C. for 30 seconds, and shake-off drying was carried out. As a result of the above, a 1:1 LS pattern having a line width of 50 nm and a pitch of 100 nm was formed.

[Evaluation of Optimum Exposure Amount (Eop)]

According to the forming method in <Resist pattern formation> described above, an optimum exposure amount Eop ($\mu C/cm^2$) for forming the LS pattern having the target size was determined. The results are shown in Table 2.

[Evaluation of Linewise Roughness (LWR)]

$3\sigma$ of the LS pattern formed in <Resist pattern formation> described above, which is a scale indicating LWR, was determined. The results are shown in Table 2.

"$3\sigma$" indicates a triple value ($3\sigma$) (unit: nm) of the standard deviation ($\sigma$) determined from measurement results obtained by measuring 400 line positions in the longitudinal direction of the line with a scanning electron microscope (acceleration voltage: 800V, product name: S-9380, manufactured by Hitachi High-Tech Corporation).

The smaller the value of $3\sigma$ is, the smaller the roughness in the line side wall is, which means an LS pattern having a more uniform width was obtained.

[Evaluation of Scum]

The LS pattern formed in <Resist pattern formation> described above was observed with a scanning electron microscope S-9380 (manufactured by Hitachi High-Tech Corporation), and the amount of scum generated was evaluated according to the following criteria. At that time, the observed range was 400 nm 2 including four or more spaces. The results are shown in Table 2.

[Evaluation Criteria]

A: No scum was generated after development.

B: 1 or more and less than 10 scums were generated after development.

C: 10 or more scums were generated after development.

TABLE 2

| | Sensitivity [μC/cm$^2$] | LWR [nm] | Scum |
|---|---|---|---|
| Example 1 | 92 | 2.41 | A |
| Example 2 | 86 | 2.43 | A |
| Example 3 | 90 | 2.48 | A |
| Example 4 | 82 | 2.35 | A |
| Example 5 | 82 | 2.31 | A |
| Comparative Example 1 | 95 | 2.51 | C |
| Comparative Example 2 | 100 | 2.55 | B |
| Comparative Example 3 | 85 | 4.20 | C |

From the results shown in Table 2, it can be seen that the resist compositions of Examples have good evaluation results regarding any of sensitivity, LWR, and scum. It can be seen that the resist compositions of Comparative Examples are inferior in any one of the evaluation result of sensitivity, LWR, or scum and is particularly inferior in the evaluation result of scum.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

What is claimed is:

1. A resist composition, comprising:

a metal compound, wherein a structure of the metal compound is changed upon exposure, and the metal compound exhibits changed solubility in a developing solution, and the metal compound includes a cubane-structured metal oxide.

2. The resist composition according to claim 1, wherein the cubane-structured metal oxide is a compound represented by General Formula (m-0):

(m-0)

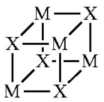

wherein M represents a metal atom of Group 3 to Group 16 and contains a bonder that is bonded to the metal atom, X represents an oxygen atom and may contain a bonder that is bonded to the oxygen atom, and M may be bonded to X through a bonder.

3. The resist composition according to claim 2, wherein the metal atom is Sn, In, Te, Ni, Co, or W.

4. A method for forming a resist pattern, comprising:

forming a resist film on a support using the resist composition according to claim 1;

exposing the resist film; and developing the exposed resist film to form a resist pattern.

5. The method for forming a resist pattern according to claim 4, wherein the resist film is exposed with an extreme ultraviolet (EUV) ray or an electron beam (EB).

* * * * *